(12) United States Patent
Sadrozinski et al.

(10) Patent No.: US 9,613,993 B2
(45) Date of Patent: Apr. 4, 2017

(54) SEGMENTED AC-COUPLED READOUT FROM CONTINUOUS COLLECTION ELECTRODES IN SEMICONDUCTOR SENSORS

(71) Applicants: The Regents of the University of California, Oakland, CA (US); Istituto Nazionale di Fisica Nucleare, Turin (IT)

(72) Inventors: Hartmut F. W. Sadrozinski, Palo Alto, CA (US); Abraham Seiden, San Jose, CA (US); Nicolo Cartiglia, Milan (IT)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 15/199,382

(22) Filed: Jun. 30, 2016

(65) Prior Publication Data
US 2017/0069671 A1    Mar. 9, 2017

Related U.S. Application Data

(60) Provisional application No. 62/213,980, filed on Sep. 3, 2015.

(51) Int. Cl.
| | |
|---|---|
| *H01L 31/00* | (2006.01) |
| *H01L 31/06* | (2012.01) |
| *H01L 27/146* | (2006.01) |
| *H01L 31/053* | (2014.01) |
| *H01L 31/0224* | (2006.01) |
| *H01L 31/02* | (2006.01) |

(52) U.S. Cl.
CPC .. *H01L 27/14603* (2013.01); *H01L 27/14641* (2013.01); *H01L 27/14643* (2013.01); *H01L 31/02005* (2013.01); *H01L 31/022408* (2013.01); *H01L 31/053* (2014.12)

(58) Field of Classification Search
CPC ......... H01L 27/14603; H01L 27/14641; H01L 27/14643; H01L 31/053; H01L 31/02005; H01L 31/022408
USPC ................ 257/443, 448, 459, 461, E27.133, 257/E27.149; 250/389, 370.01
See application file for complete search history.

(56) References Cited

U.S. PATENT DOCUMENTS

| | | | | |
|---|---|---|---|---|
| 5,225,696 A | * | 7/1993 | Bahraman | ......... H01L 27/14887 250/208.1 |
| 5,589,705 A | * | 12/1996 | Saito | ................. H01L 27/14643 257/443 |
| 6,188,089 B1 | | 2/2001 | Spartiotis | |
| 6,380,603 B1 | * | 4/2002 | Takimoto | .............. H01L 27/144 257/461 |
| 7,060,523 B2 | | 6/2006 | Tindall et al. | |
| 7,411,197 B2 | | 8/2008 | He et al. | |
| 2016/0018535 A1 | * | 1/2016 | Lee | ..................... H01L 27/1461 250/361 R |

* cited by examiner

*Primary Examiner* — Dao H Nguyen
(74) *Attorney, Agent, or Firm* — Lumen Patent Firm

(57) ABSTRACT

Position sensitive radiation detection is provided using a continuous electrode in a semiconductor radiation detector, as opposed to the conventional use of a segmented electrode. Time constants relating to AC coupling between the continuous electrode and segmented contacts to the electrode are selected to provide position resolution from the resulting configurations. The resulting detectors advantageously have a more uniform electric field than conventional detectors having segmented electrodes, and are expected to have much lower cost of production and of integration with readout electronics.

9 Claims, 5 Drawing Sheets sensors.

SEGMENTED AC-COUPLED READOUT FROM CONTINUOUS COLLECTION ELECTRODES IN SEMICONDUCTOR SENSORS

CROSS REFERENCE TO RELATED APPLICATIONS

This application claims the benefit of U.S. provisional patent application 62/213,980, filed on Sep. 3, 2015, and hereby incorporated by reference in its entirety.

GOVERNMENT SPONSORSHIP

This invention was made with Government support under contract DESC0010107 awarded by the Department of Energy. The Government has certain rights in the invention.

FIELD OF THE INVENTION

This invention relates to position sensitive semiconductor radiation detectors.

BACKGROUND

For semiconductor radiation detectors, it is often desired to provide a position readout for detected radiation. Conventionally, position sensitivity can be provided by using a segmented electrode. However, such segmented electrodes can be disadvantageous in practice because they increase device complexity and create undesirable non-uniform electric fields within the detector.

FIG. 1 shows an example of this conventional approach. Here the body of the detector is referenced as 102, 104 is a p++ back side electrode and the n++ top electrode is segmented (i.e., electrodes 106a, 106b, and 106c) to provide position resolution. Electrical contact to the top electrodes can be made via aluminum contacts 108a, 108b, and 108c through insulator 110. Such contact is via AC coupling between the contacts and the corresponding electrode segments.

FIG. 2 shows typical electrical field modeling results for a configuration as in FIG. 1. It is apparent that the electric field is highly non-uniform. This has several drawbacks: (i) high field at the edge of the electrode can cause the detector to go into breakdown prematurely; (ii) the uneven electric field accelerates the charge carriers differently depending on their positions, producing very different signals as a function of the position of the impinging radiation (i.e., pulse time dispersion of collected charge); and (iii) the possibility of two adjacent readout electrodes becoming electrically connected due to radiation damage.

Accordingly, it would be an advance in the art to provide position sensitive radiation detectors that are free from such disadvantages.

SUMMARY

We have found, somewhat paradoxically, that position sensitive radiation detection can be provided using a continuous electrode, as opposed to the conventional use of a segmented electrode. FIG. 3 schematically shows the concept. Here the segmented electrodes 106a, 106b and 106c of FIG. 1 are replaced with a single continuous n++ electrode 112. Surprisingly, it turns out to be sufficient, as described in greater detail below, to only have the contacts (108a, 108b, 108c on FIG. 3) be segmented in order to provide position resolution. Since the electric field within the detector is determined by a bias applied to the electrodes, the resulting electric field is very uniform, as shown in the modeling results of FIG. 4. This electric field uniformity alleviates the above-described disadvantages of the conventional segmented electrode approach.

Three important features of this work are as follows:

1) We provide semiconductor sensors with uniform charge collection and high spatial resolution. Usually segmented semiconductor detectors have non-continuous electrodes to provide position resolution. These problems can be avoided by using a continuous electrode. The position is determined by coupling the collected charge through a capacitor from a resistive electrode into segmented metal contact pads that are read out;

2) The use of a continuous electrode allows cheaper production; and

3) The use of a continuous electrode allows a simplified implementation of charge multiplication on the electrode with the largest field strength.

Advantages in practice include being less prone to radiation damage, requiring less precision in fabrication (e.g., in mask alignment), and providing larger dynamic range due to a wider range of operating voltages.

DETAILED DESCRIPTION

Figure 1:
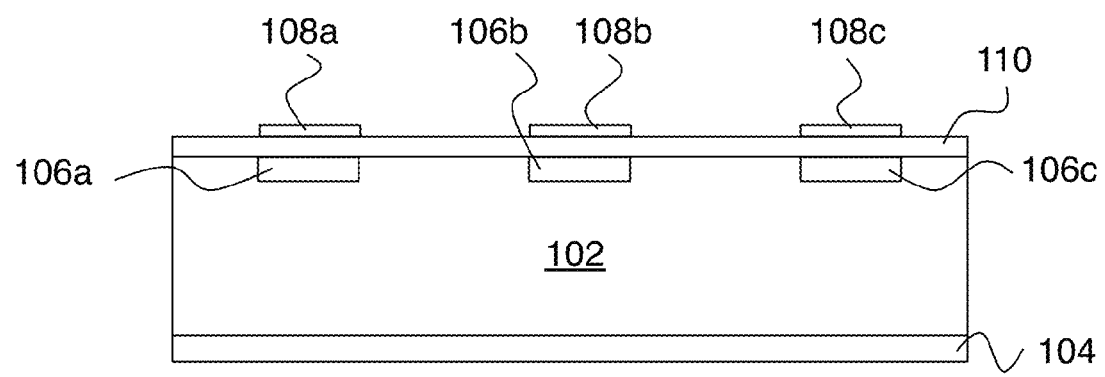
FIG. 1 shows a conventional position sensitive detector.
Figure 2:
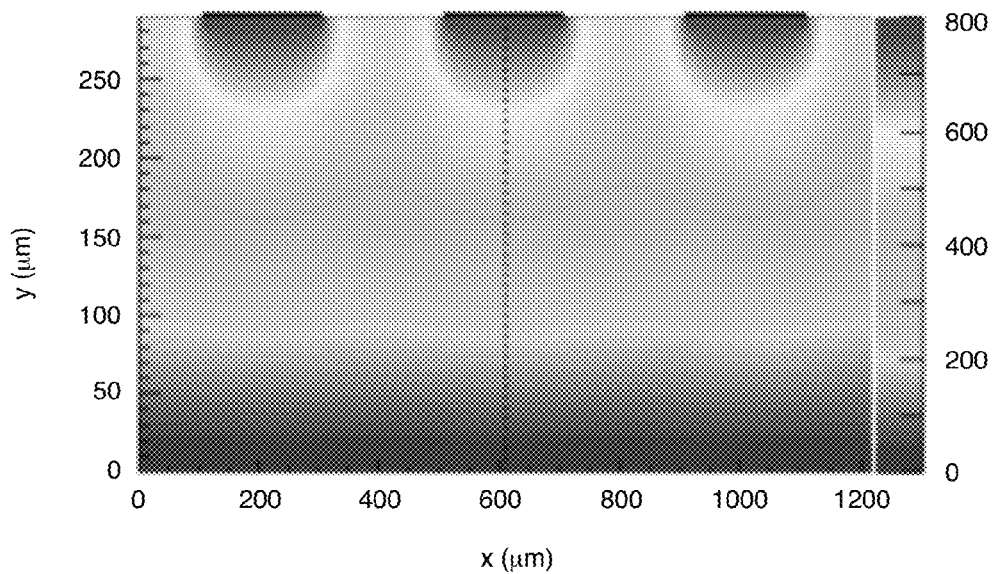
FIG. 2 shows electric field modeling results for a conventional position sensitive detector approach as in FIG. 1.
Figure 3:
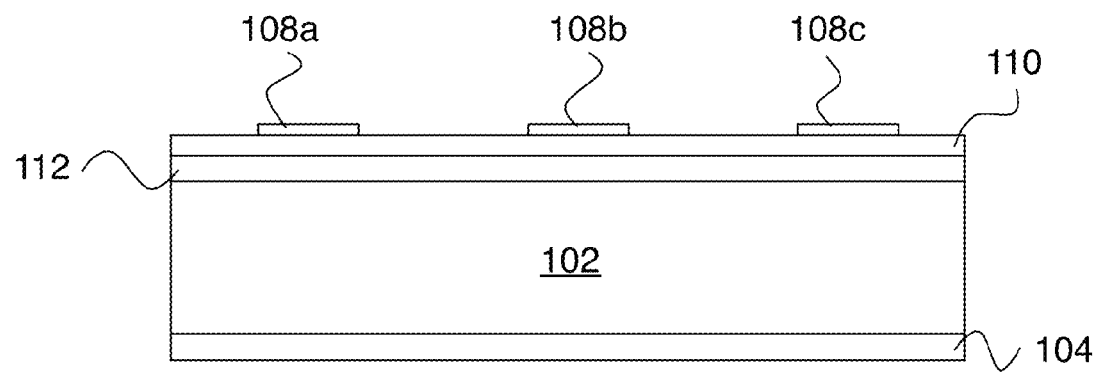
FIG. 3 schematically shows the position sensitive detector concept of the present invention.
Figure 4:
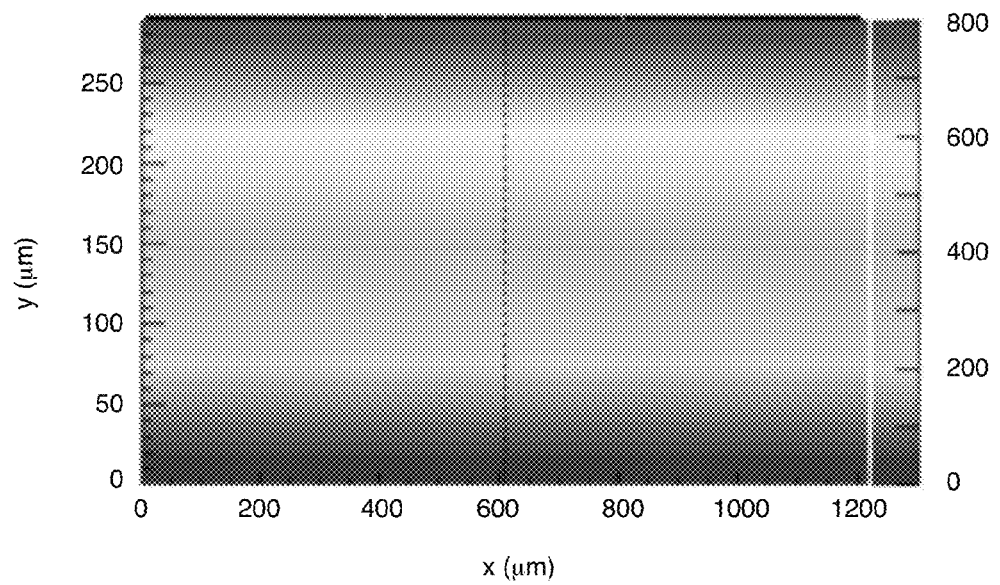
FIG. 4 shows electric field modeling results for a position sensitive detector approach as in FIG. 3.
Figure 5:
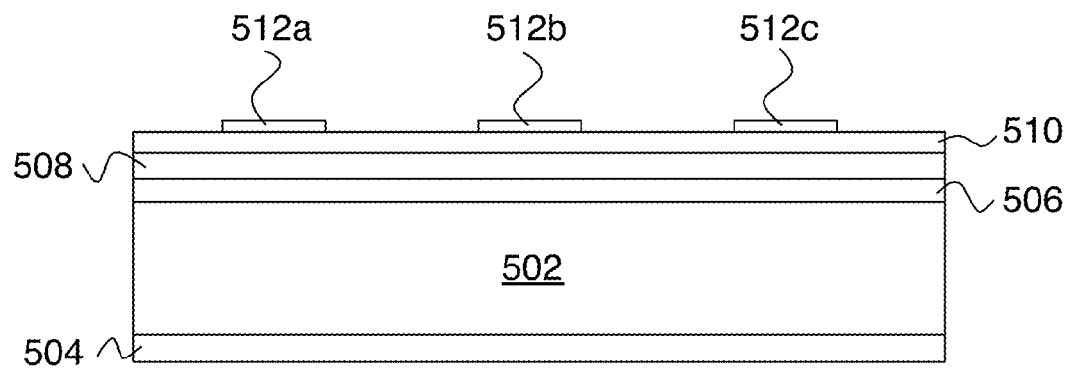
FIG. 5 shows a first embodiment of the invention.

FIG. 5 shows a first exemplary embodiment of the invention. In this example, 504 is a p++ electrode, 502 is a p− body layer, 506 is a p+ gain layer, 508 is an n++ electrode that is continuous as described above, 510 is an insulating layer, and 512a, 512b, 512c are segmented contacts that are AC coupled to electrode 508. Here the doping of p+ gain layer 506 and n++ electrode 508 determines the gain of the detector according to known principles of radiation detector design. The resulting overall layer sequence is n++/p+/p−/p++ with the n++ electrode having segmented contacts (n-on-p).

It is convenient to define n-on-p as referring to a detector whose bulk is p-doped and the diode is formed by adding n-doping on the surface. Similarly, p-on-n refers to a detector whose bulk is n-doped and the diode is formed by adding p-doping on the surface. p-on-p refers to a detector whose bulk is p-doped and having a buried p-n junction where the segmented electrode is p++ at the surface. Similarly n-on-n refers to a detector whose bulk is n-doped and having a buried p-n junction where the segmented electrode is n++ at the surface.

The doping types can be interchanged in the embodiment of FIG. 5. In this case, 504 is an n++ electrode, 502 is an n− body layer, 506 is an n+ gain layer, 508 is a p++ electrode that is continuous as described above, 510 is an insulating layer, and 512a, 512b, 512c are segmented contacts that are AC coupled to electrode 508. Here the doping of n+ gain layer 506 and p++ electrode 508 determines the gain of the detector according to known principles of radiation detector design. The resulting overall layer sequence is p++/n+/n−/n++ with the p++ electrode having segmented contacts (p-on-n).

Designs as in FIG. 5 have the disadvantage of reduced design flexibility. The reason for this is that the resistance of the continuous electrode is an important parameter for providing spatial resolution as described below, and also affects the detector gain as indicated above because the doping determines the resistance.

Figure 6:
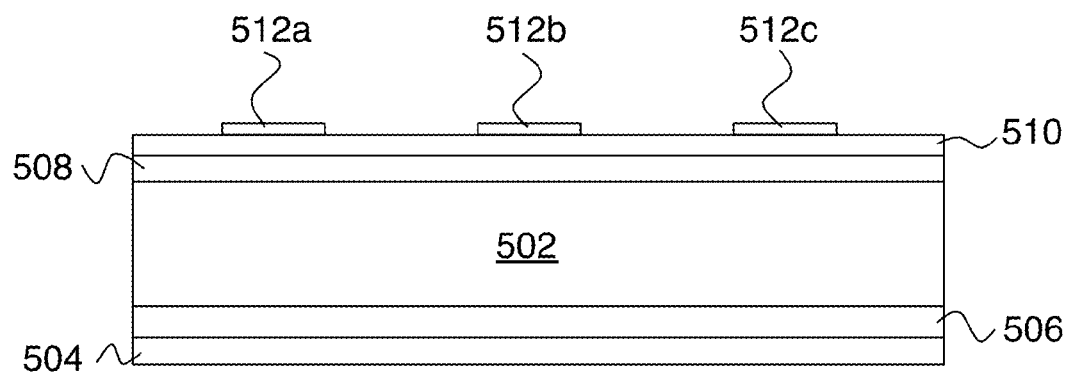
FIG. 6 shows a second embodiment of the invention.

Accordingly, designs as in FIG. 6 are preferred. In this example, 504 is an n++ electrode, 502 is a p− body layer, 506 is a p+ gain layer, 508 is a p++ electrode that is continuous as described above, 510 is an insulating layer, and 512a, 512b, 512c are segmented contacts that are AC coupled to electrode 508. Here the doping of p+ gain layer 506 and n++ electrode 504 determines the gain of the detector according to known principles of radiation detector design, and the doping/resistance of p++ electrode 508 only affects the spatial resolution of the detector. Thus the detector gain and electrode design for spatial resolution are decoupled from each other. The resulting overall layer sequence is p++/p−/p+/n++ with the p++ electrode having segmented contacts (p-on-p).

The doping types can also be interchanged in the embodiment of FIG. 6. In this case, 504 is a p++ electrode, 502 is an n− body layer, 506 is an n+ gain layer, 508 is an n++ electrode that is continuous as described above, 510 is an insulating layer, and 512a, 512b, 512c are segmented contacts that are AC coupled to electrode 508. Here the doping of n+ gain layer 506 and p++ electrode 504 determines the gain of the detector according to known principles of radiation detector design, and the doping/resistance of n++ electrode 508 only affects the spatial resolution of the detector. The resulting overall layer sequence is n++/n−/n+/p++ with the n++ electrode having segmented contacts (n-on-n).

In more general terms, one embodiment of the invention is a position-sensitive radiation detector including:

i) a semiconductor region (e.g., 502 and 506 on FIG. 5) configured to absorb radiation and to provide electrical charge carriers in response to absorbed radiation, where the semiconductor region has opposing first and second surfaces;

ii) a first electrode (e.g., 508 on FIG. 5) disposed on the first surface, where the first electrode is configured as a continuous first layer;

iii) a second electrode (e.g., 504 on FIG. 5) disposed on the second surface, where the second electrode is configured as a continuous second layer, and where electrical bias is provided to the semiconductor region by providing a voltage to the first and second electrodes;

iv) an insulating layer (e.g., 510 on FIG. 5) disposed on the first electrode;

v) two or more contacts (e.g., 512a, 512b, 512c on FIG. 5) disposed on the insulating layer and AC-coupled to the first electrode, where signals from the two or more contacts provide position information for the absorbed radiation.

Practice of the invention does not depend critically on the type of radiation to be detected (e.g., particles and/or energetic electromagnetic radiation), or on the specific conducting, insulating and semiconducting materials employed (e.g., aluminum, silicon oxide, silicon etc.), or on the specific thicknesses of the semiconductor layers. In the above examples, n++ and p++ refer to doping levels of about 1e19 $cm^{-3}$ (e.g., 3e18 to 3e19 $cm^{-3}$) for n-type and p-type respectively, n+ and p+ refer to doping levels of about 1e16 $cm^{-3}$ (e.g., 3e15 to 3e16 $cm^{-3}$) for n-type and p-type respectively, and n− and p− refer to doping levels of less than about 1e13 $cm^{-3}$ for n-type and p-type respectively. Doping and thicknesses of semiconductor layers can be selected to provide suitable detector gain according to known design principles. Novel design principles relating to providing position resolution using continuous electrodes are described in greater detail below.

Figure 7:
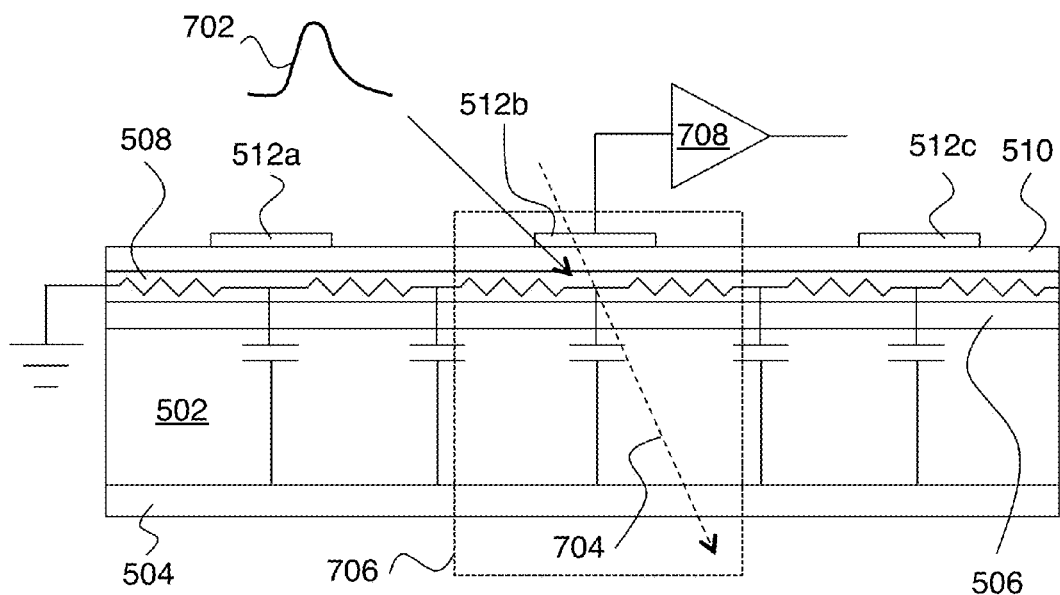
FIG. 7 schematically shows operation of the embodiment of FIG. 5.
Figure 8:
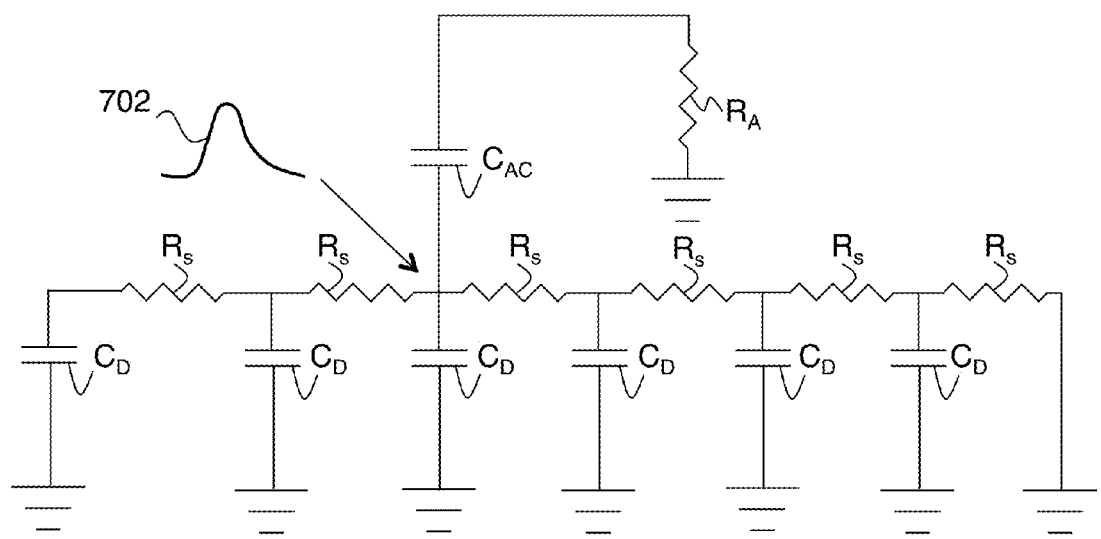
FIG. 8 shows an electrical model relating to FIG. 7.

FIGS. 7 and 8 shows operating principles relating to embodiments of the invention, with reference to the example of FIG. 5. Here electrode 508 has a distributed sheet resistance $R_s$ as shown and the detector as a whole has a distributed capacitance $C_D$, also as shown. When radiation 704 interacts with the detector, an electrical pulse 702 can be received by amplifier 708. With appropriate design as described below, we can ensure that each contact (e.g., contact 512b) only sees a small part of the detector (e.g., region 706 on FIG. 7), thereby effectively providing position resolution. Having the AC read-out only see a small part of the detector also advantageously reduces leakage current and effective detector capacitance.

A resistive implant for the continuous n++(or p++) electrode of sheet resistivity $R_\square \sim$ 1 kOhm, combined with an appropriate thickness of the insulator 510 can be used to produce a suitable capacitance $C_{AC}$ between the contact pads and the continuous electrode. An important point of the design is that the combination of the electrode resistivity $R_s$ and the contact pad capacitance $C_{AC}$ form an RC circuit with time constant $\tau = R_s C_{AC}$ that allows the signal to be transmitted to the segmented aluminum pads as if the electrode was segmented. The resistivity of the electrode and the value of capacitance created by the AC coupling oxide can be determined by simulation of the sensor.

For this design to efficiently transmit the signal to the aluminum pads, the time constant $\tau$ should be (i) longer than the typical duration of a signal in the semiconductor detector under consideration, otherwise the signal disappears too soon and the AC coupling mechanism would not work and (ii) shorter than the typical repetition time of the signal otherwise the signal charge is trapped under the oxide for too much time. More specifically, the time constant $\tau$ is preferably greater than 1 ns and is more preferably greater than 5 ns. The time constant $\tau$ is preferably less than 25 ns.

Amplifier 708 on FIG. 7 can be regarded as having an input resistance $R_A$. The additional rise time given by $R_A C_D$ is roughly 0.1 ns for typical circuit parameters, which is effectively negligible.

Figure 9:
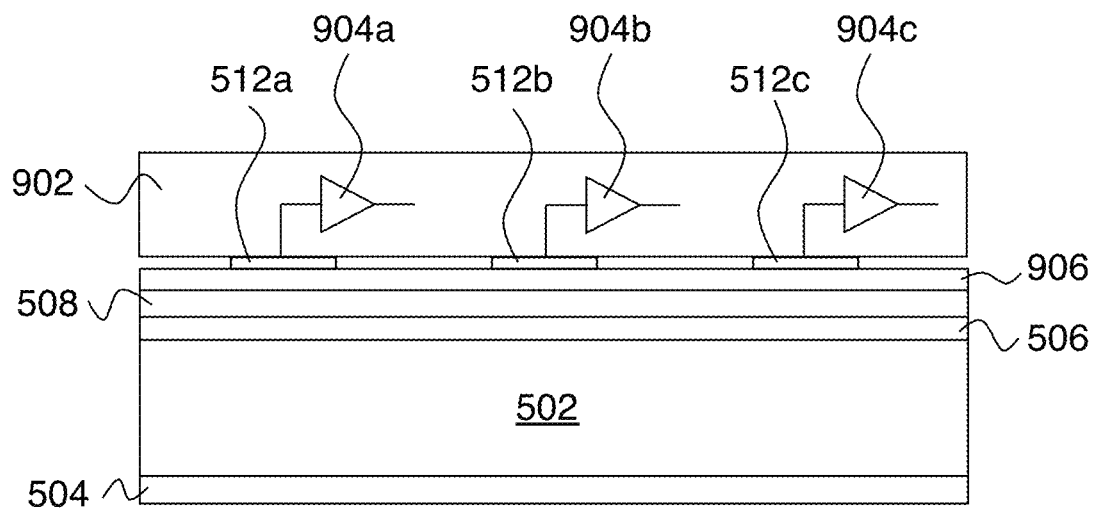
FIG. 9 shows a third embodiment of the invention.
Figure 10:
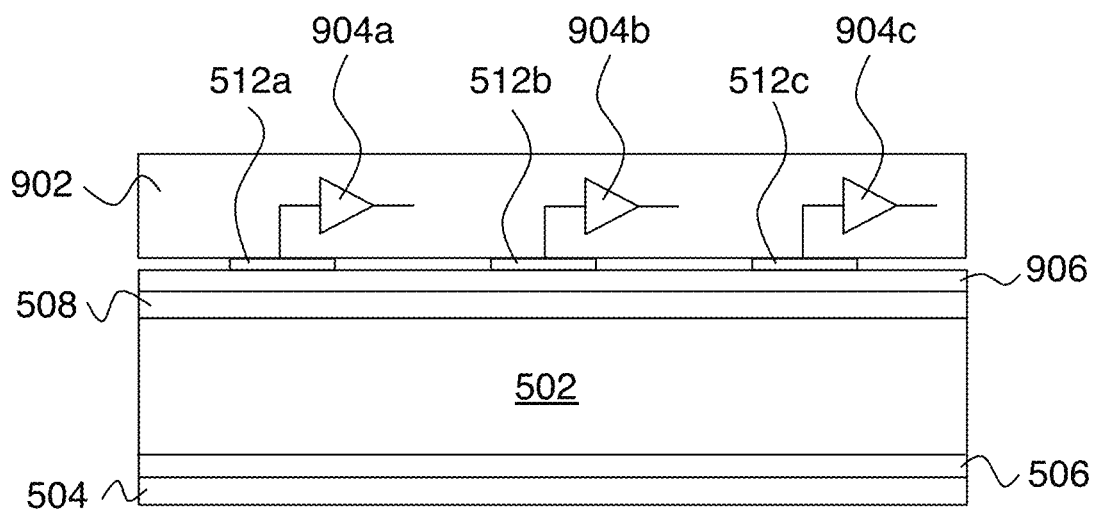
FIG. 10 shows a fourth embodiment of the invention.

The present approach may also facilitate integration of detectors with detector electronics. The examples of FIGS. 9 and 10 correspond to the examples of FIGS. 5 and 6, respectively, except that insulating layer 510 is instead an adhesive layer 906, and read-out chip 902 including amplifiers 904a, 904b, 904c is shown. This bonding approach can be used instead of conventional bump bonding.

The invention claimed is:

1. A position-sensitive radiation detector comprising:
a semiconductor region configured to absorb radiation and to provide electrical charge carriers in response to absorbed radiation, wherein the semiconductor region has opposing first and second surfaces;
a first electrode disposed on the first surface, wherein the first electrode is configured as a continuous first layer;

a second electrode disposed on the second surface, wherein the second electrode is configured as a continuous second layer, wherein electrical bias is provided to the semiconductor region by providing a voltage to the first and second electrodes;

an insulating layer disposed on the first electrode;

two or more contacts disposed on the insulating layer and AC-coupled to the first electrode, wherein signals from the two or more contacts provide position information for the absorbed radiation.

2. The position-sensitive radiation detector of claim 1, wherein a time constant of AC coupling between the two or more contacts and the first electrode is greater than 1 ns.

3. The position-sensitive radiation detector of claim 1, wherein a time constant of AC coupling between the two or more contacts and the first electrode is less than 25 ns.

4. The position-sensitive radiation detector of claim 1, wherein the semiconductor region comprises a layer stack of p+/p− semiconductor material.

5. The position-sensitive radiation detector of claim 4, wherein the first electrode is n++ semiconductor material, wherein the second electrode is p++ semiconductor material, and wherein an overall layer sequence is n++/p+/p−/p++.

6. The position-sensitive radiation detector of claim 4, wherein the first electrode is p++ semiconductor material, wherein the second electrode is n++ semiconductor material, and wherein an overall layer sequence is p++/p−/p+/n++.

7. The position-sensitive radiation detector of claim 1, wherein the semiconductor region comprises a layer stack of n+/n− semiconductor material.

8. The position-sensitive radiation detector of claim 7, wherein the first electrode is n++ semiconductor material, wherein the second electrode is p++ semiconductor material, and wherein an overall layer sequence is n++/n−/n+/p++.

9. The position-sensitive radiation detector of claim 7, wherein the first electrode is p++ semiconductor material, wherein the second electrode is n++ semiconductor material, and wherein an overall layer sequence is p++/n+/n−/n++.

* * * * *